(12) United States Patent
Wang et al.

(10) Patent No.: US 12,453,039 B2
(45) Date of Patent: Oct. 21, 2025

(54) HEATSINK AND COMMUNICATION DEVICE HAVING THE HEATSINK

(71) Applicant: Telefonaktiebolaget LM Ericsson (publ), Stockholm (SE)

(72) Inventors: Haijiang Wang, Beijing (CN); Shuaijun Li, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 187 days.

(21) Appl. No.: 18/254,252

(22) PCT Filed: Jan. 4, 2021

(86) PCT No.: PCT/CN2021/070127
§ 371 (c)(1),
(2) Date: May 24, 2023

(87) PCT Pub. No.: WO2022/141626
PCT Pub. Date: Jul. 7, 2022

(65) Prior Publication Data
US 2024/0008214 A1 Jan. 4, 2024

(51) Int. Cl.
*H05K 7/20* (2006.01)
(52) U.S. Cl.
CPC .................. *H05K 7/20163* (2013.01)
(58) Field of Classification Search
CPC . F28D 15/025; F28D 15/0233; F28D 15/0216
See application file for complete search history.

(56) References Cited

U.S. PATENT DOCUMENTS

| | | | | |
|---|---|---|---|---|
| 5,396,947 A * | 3/1995 | Itoh | ...................... | F28D 15/0275 29/890.032 |
| 6,062,302 A * | 5/2000 | Davis | .................... | F28D 15/046 165/185 |
| 6,357,517 B1 * | 3/2002 | Osakabe | ............. | F28D 15/0233 165/104.21 |
| 7,017,657 B2 * | 3/2006 | Sugito | ................. | F28D 15/0266 257/714 |
| 8,134,833 B2 * | 3/2012 | Agostini | ............. | F28D 15/0266 174/15.1 |
| 2007/0258213 A1 * | 11/2007 | Chen | ...................... | H01L 23/427 257/E23.088 |
| 2013/0340978 A1 * | 12/2013 | Agostini | ............ | H05K 7/20309 165/104.21 |

(Continued)

FOREIGN PATENT DOCUMENTS

| CN | 105140194 A | 12/2015 |
|---|---|---|
| CN | 109640594 A | 4/2019 |

(Continued)

*Primary Examiner* — Devon Lane
(74) *Attorney, Agent, or Firm* — Murphy, Bilak & Homiller, PLLC

(57) ABSTRACT

A heatsink and a communication device having the heatsink are disclosed. The heatsink comprises a heatsink base and a plurality of heatsink fins. Each heatsink fin includes a fin bottom joined to the heatsink base and a fin top opposite to the fin bottom. A plurality of flow channels are formed in at least one of the heatsink fins to extend obliquely from the fin bottom towards the fin top. The plurality of flow channels merge into a public channel formed at the fin top.

12 Claims, 3 Drawing Sheets

(56) References Cited

U.S. PATENT DOCUMENTS

2018/0308780 A1* 10/2018 Tong .................... H01L 23/3733
2020/0037470 A1    1/2020 Tong et al.
2022/0128316 A1*  4/2022 Wen .................... F28D 15/0233

FOREIGN PATENT DOCUMENTS

| CN | 110351991 A | * | 10/2019 | |
|---|---|---|---|---|
| CN | 110446398 A | | 11/2019 | |
| CN | 210112491 U | | 2/2020 | |
| CN | 111256505 A | * | 6/2020 | |
| EP | 2677261 A1 | | 12/2013 | |
| WO | WO-2018121533 A1 | * | 7/2018 | ............... H05K 7/20 |

* cited by examiner

HEATSINK AND COMMUNICATION DEVICE HAVING THE HEATSINK

TECHNICAL FIELD

The present disclosure generally relates to components of communication device, and more particularly, to a heatsink for dissipating heat from heat sources.

BACKGROUND

This section introduces aspects that may facilitate better understanding of the present disclosure. Accordingly, the statements of this section are to be read in this light and are not to be understood as admissions about what is in the prior art or what is not in the prior art.

Aluminum heatsink for natural convection cooling is widely used on communication product. As the increase of product dimension and heat dissipation, the heatsink dimension becomes larger. The negative impact of the trend is that, the whole heatsink cooling efficiency will become lower because of the limited thermal conductivity of the common heatsink material. Phase change heat transfer is a high-efficiency heat transfer way. This technology can obviously improve the heat transfer of heatsink and help to dissipate more heat compared with aluminum heatsink based on the same heatsink dimension.

Heat pipe and vapor chamber are mature solutions which use phase change heat transfer technology, and are applied as separate loose parts mounted on a heatsink base. Recently, phase change heat transfer design inside special heatsink fins has also been realized on communication products. But all of those technologies are phase change heat transfer application in partial areas of the heatsink.

The heat pipe and vapor chamber can only have limited cooling benefit for local hot spots in the system. The phase change heat transfer inside the heatsink fin can improve the heat transfer on the heatsink fin but is still not good enough. For a chip with high power density, the thermal resistance of a heatsink base is relatively large under this condition, which results in a large temperature difference between the chip and heatsink fins. How to improve the thermal conductivity of both base and fin areas of a heatsink in an associated way will be a critical way to further ramp up the cooling capacity of the heatsink.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide a heatsink that can overcome uneven phase change heat transfer which is influenced by gravity effect when the heatsink is vertically mounted and that can significantly improve the heat spreading on the heatsink.

According to a first aspect of the disclosure, there is provided a heatsink. The heatsink comprises a heatsink base and a plurality of heatsink fins. Each heatsink fin includes a fin bottom joined to the heatsink base and a fin top opposite to the fin bottom. A plurality of flow channels are formed in at least one of the heatsink fins to extend obliquely from the fin bottom towards the fin top. The plurality of flow channels merge into a public channel formed at the fin top.

In an embodiment of the disclosure, the plurality of flow channels and the public channel are formed at a lower part of the at least one heatsink fin and are filled with refrigerant.

In an embodiment of the disclosure, the public channel is communicated with an upper space of the at least one heatsink fin which is not filled with refrigerant.

In an embodiment of the disclosure, the at least one heatsink fin is made from two halves which are soldered together, each half being produced by sheet metal process such as stamping.

In an embodiment of the disclosure, the heatsink base has an internal space, a lower portion of which comprises multiple substantially closed zones, each zone being communicated with one or more of the plurality of flow channels in the at least one heatsink fin.

In an embodiment of the disclosure, through holes for pressure balance are formed in a separator between adjacent substantially closed zones.

In an embodiment of the disclosure, the substantially closed zones of the heatsink base are filled with refrigerant, and an upper portion of the internal space of the heatsink base is not filled with refrigerant.

According to a second aspect of the disclosure, there is provided a heatsink. The heatsink comprises a heatsink base and a plurality of heatsink fins. Each heatsink fin includes a fin bottom joined to the heatsink base and a fin top opposite to the fin bottom. The heatsink base has an internal space. A lower portion of the internal space is filled with refrigerant and is divided into substantially closed zones. An upper portion of the internal space is not filled with refrigerant.

In an embodiment of the disclosure, through holes for pressure balance are formed in a separator between adjacent substantially closed zones.

According to a third aspect of the disclosure, there is provided a communication device. The communication device includes a plurality of heat sources and a heatsink according to the first or second aspect of the disclosure, wherein the heat sources contact the heatsink base at a side opposite to the heatsink fins.

In an embodiment of the disclosure, the heatsink is vertically mounted.

In an embodiment of the disclosure, distribution of the substantially closed zones of the heatsink base corresponds to distribution of the heat sources.

BRIEF DESCRIPTION OF THE DRAWINGS

These and other objects, features and advantages of the disclosure will become apparent from the following detailed description of illustrative embodiments thereof, which are to be read in connection with the accompanying drawings.

DETAILED DESCRIPTION

The embodiments of the present disclosure are described in detail with reference to the accompanying drawings. It should be understood that these embodiments are discussed only for the purpose of enabling those skilled in the art to better understand and thus implement the present disclosure, rather than suggesting any limitations on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. Those skilled in the relevant art will recognize that the disclosure may be practiced without one or more of the specific features or advantages of a particular embodiment. In other instances, additional features and advantages may be recognized in certain embodiments that may not be present in all embodiments of the disclosure.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Figure 1:
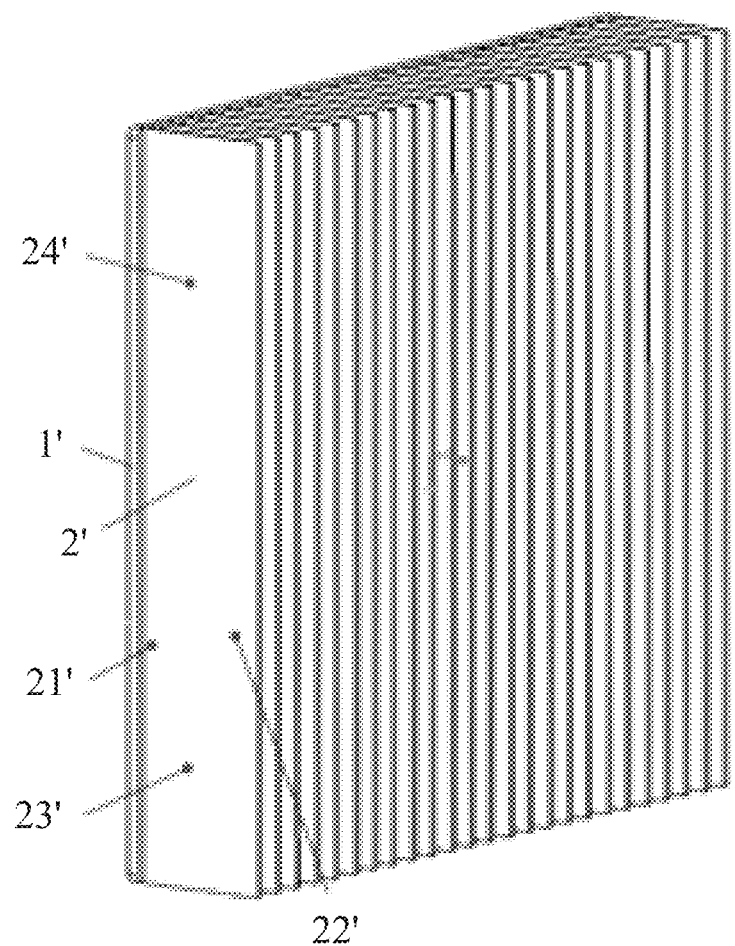
FIG. 1 is a perspective view illustrating a traditional plate-fin heatsink.

FIG. 1 is a perspective view illustrating a traditional plate-fin heatsink. As shown in FIG. 1, the traditional plate-fin heatsink is generally mounted vertically to have best cooling performance by natural convection. The plate-fin heatsink consists of a heatsink base 1' and many heatsink fins 2'. Each heatsink fin 2' is joined to the heatsink base 1' at the respective fin bottom 21'. Many heat sources (not shown) contact the heatsink base 1' at its back side, so heat from the heat sources will be conducted to the heatsink base 1' and then be transferred from the fin bottoms 21' to the fin tops 22'. In the same time, air between adjacent heatsink fins 2' is heated and flows from a lower side 23' of the heatsink fins 2' to an upper side 24' of the heatsink fins 2', so the heat will be taken away by natural convection.

Figure 2:
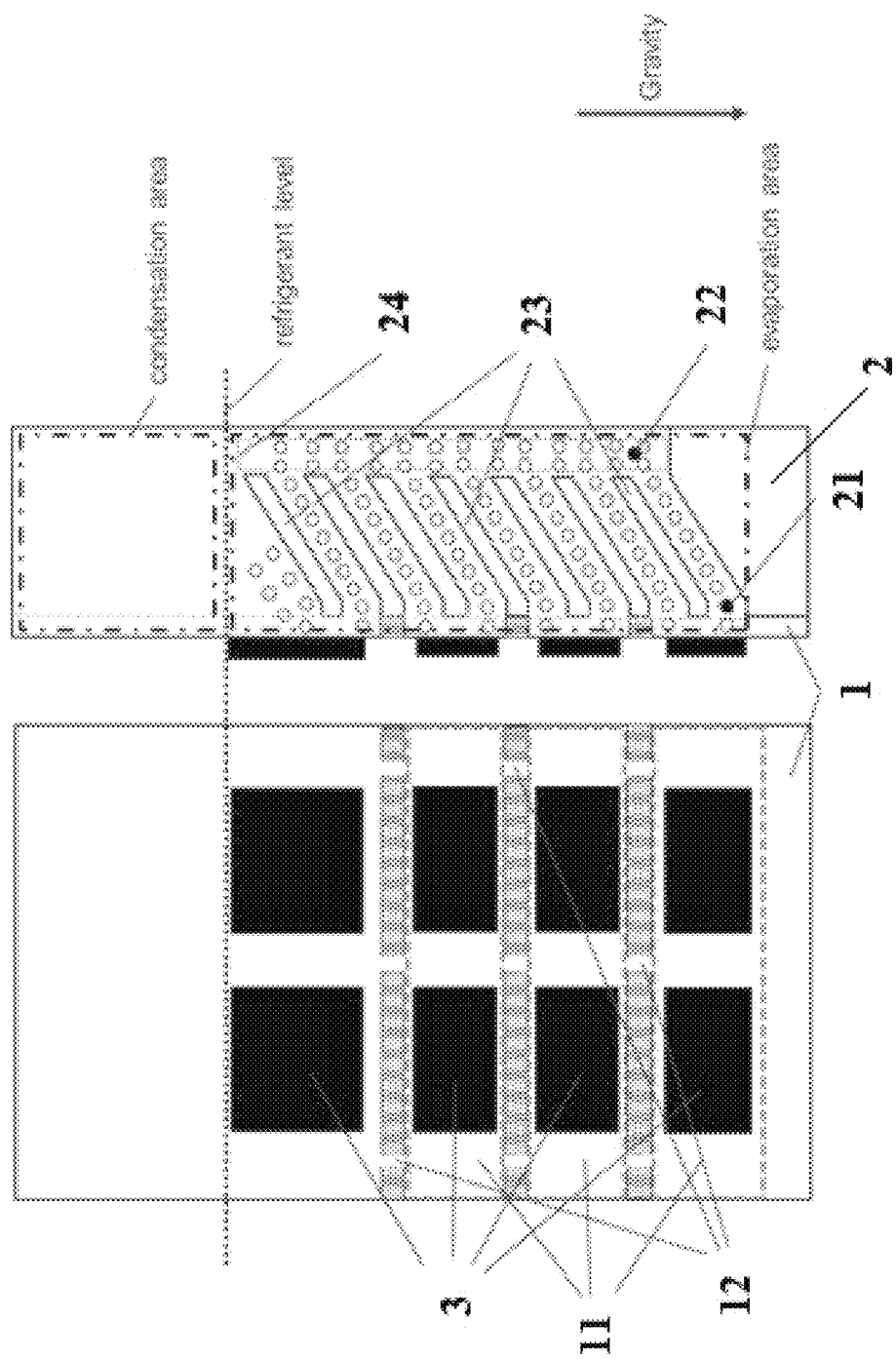
FIG. 2 is a view illustrating flow channels inside a heatsink according to an embodiment of the disclosure.

FIG. 2 is a view illustrating a heatsink according to an embodiment of the disclosure. The heatsink according to this embodiment is also vertically mounted, and includes a heatsink base 1 and many heatsink fins 2. Many heat sources 3 contact the heatsink base 1 at a side opposite to the heatsink fins 2. The heatsink according to this embodiment differs from the plate-fin heatsink shown in FIG. 1 mainly in that internal flow channels are provided in both the heatsink base 1 and the heatsink fins 2. The left portion of FIG. 2 illustrates the flow channels inside the heatsink base 1, and the right portion of FIG. 2 illustrates the flow channels inside one of the heatsink fins 2.

Specifically, the heatsink base 1 has an internal space which is partially filled with refrigerant. At a lower part of the heatsink base 1, the internal space is divided by separators into substantially closed zones 11. The division of the substantially closed zones 11 of the heatsink base 1 is based on distribution of the heat sources 3. That is, distribution of the substantially closed zones 11 of the heatsink base corresponds to distribution of the heat sources 3. It should be noted that the "lower part" herein does not mean the lower half of the heatsink base 1. As a non-restrictive example, the "lower part" may take up more than 60%, or even more than 70%, of the heatsink base 1 from the lower side. The separators and the substantially closed zones 11 both extend horizontally. Several through holes 12 are formed in the separators between adjacent substantially closed zones 11. In the illustrated embodiment, four substantially closed zones 11 are defined by means of three separators, three through holes 12 are formed in each separator, and two heat sources 3 are assigned to each substantially closed zone 11. However, it will be readily appreciated by those skilled in the art that there is no limitation to the number/amount of the mentioned parts or members.

Each heatsink fin 2 includes a fin bottom 21 joined to the heatsink base 1 and a fin top 22 opposite to the fin bottom 21. The heatsink fin 2 also has an internal space which is partially filled with refrigerant. At a lower part of the heatsink fin 2, the internal space is divided by separators 23 into a plurality of flow channels. Also, the "lower part" herein does not mean the lower half of the heatsink fin 2, and may take up more than 60%, or even more than 70%, of the heatsink fin 2 from the lower side. The separators 23 and the flow channels both extend obliquely upwardly from the fin bottom 21 towards the fin top 22. The separators 23 further serve as bubble flow guiders, as will be described later. The plurality of flow channels merge into a public channel 24 formed at the fin top 22. The public channel 24 extends in the direction of gravity and opens to an upper space of the heatsink fin 2.

As mentioned above, the plurality of flow channels, as well as the public channel 24, are formed at the lower part of the heatsink fin 2. Each of the plurality of flow channels is communicated with a substantially closed zone 11 of the heatsink base 1. In the illustrated embodiment, seven separators 23 are provided above seven flow channels. However, it will be readily appreciated by those skilled in the art that there is no limitation to the number/amount of the separators 23 and the flow channels.

In the heatsink according to this embodiment, the substantially closed zones 11 of the heatsink base 1, as well as the plurality of flow channels and the public channel 24 of the heatsink fins 2, are filled with refrigerant. On the other hand, an upper portion of the internal space of the heatsink base 1 and the upper space of the heatsink fins 2 are not filled with refrigerant.

The heatsink according to this embodiment may be produced as follows. Firstly, the heatsink base 1 and the heatsink fins 2 are separately manufactured. For example, the heatsink base 1 could be manufactured by forging, high density die casting, or semi-solid casting, while each of the heatsink fins 2 could be manufactured by sheet metal and soldering processes. Specifically, the heatsink fin 2 is made from two parts each of which represents half of the fin geometry. The half part is produced by sheet metal process, such as stamping, to form the outline as well as the channel shape. Then the two halves are soldered together in the oven. After the heatsink base 1 and all the heatsink fins 2 are manufactured, the heatsink base 1 and the heatsink fins 2 are soldered together, with their internal flow channels being interconnected. Finally, refrigerant is filled into the internal space of the heatsink base 1 and the internal space of the heatsink fins 2, up to a certain level.

Accordingly, a three-dimensional phase change heat transfer heatsink is obtained. In such a heatsink, internal flow channels (the substantially closed zones 11) of the heatsink base 1 and internal flow channels (those between adjacent separators 23) of the heatsink fins 2 are interconnected to form a three-dimensional void space, so that the phase change heat transfer inside the whole heatsink is realized.

As mentioned above, the three-dimensional void space of the heatsink is filled with refrigerant during the manufacturing process. It should be noted that the internal space of the heatsink is only partially filled with refrigerant. The filling proportion or level may be precisely decided by the positions of the heat sources as well as the physical properties of the selected refrigerant. When the heatsink is vertically mounted, as shown in FIG. 2, the whole heatsink naturally forms a lower evaporation area and an upper condensation area for the phase change heat transfer. The heatsink internal lower space filled with the refrigerant is the evaporation area, and the heatsink internal upper space without the refrigerant is the condensation area. It will be readily appreciated by those skilled in the art that most of the heat sources should be placed within the evaporation area in the gravity direction.

Figure 3:
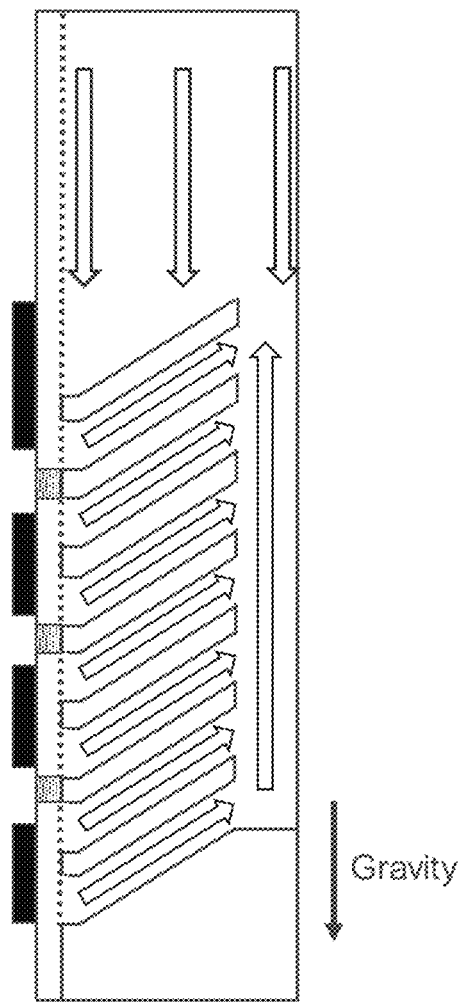
FIG. 3 is a schematic diagram illustrating a phase change heat transfer process inside the heatsink according to the embodiment.

FIG. 3 is a schematic diagram illustrating a phase change heat transfer process inside the heatsink as shown in FIG. 2. After the system is powered on, the heat sources 3 generate heat while working, and the heatsink base 1 contacting the heat sources 3 is heated. When the temperature of the heatsink base 1 reaches the boiling point of the refrigerant, a boiling phenomenon will happen and generate bubbles in the substantially closed zones 11. Due to the separators, the boiling bubbles will not rise upward easily and directly inside the heatsink base 1, and are forced to enter into the connected flow channels inside the heatsink fins 2. This means the heat source's heat is transferred from the heatsink base 1 to the fin bottom 21. After the bubbles enter into the flow channels inside the heatsink fins 2, the bubbles will flow from the fin bottom 21 to the fin top 22 along the separators 23. Then, the bubbles will enter into the public channel 24 and rise to the refrigerant level in the end. Along the bubble flow path, the bubble will have heat exchange with refrigerant and help to spread heat from the fin bottom 21 to the fin top 22 and from the fin lower side to the fin upper side. All the bubble will break up after reaching the refrigerant level, and the released vapor will condense into liquid in the condensation area. The liquid will come back to the evaporation area by the effect of gravity.

The specialized channel pattern design as described above can manage the heat flow direction of the heatsink by leading the boiling bubbles flow in the refrigerant through the flow channels in the heatsink base 1 and the heatsink fins 2. It can overcome the uneven phase change heat transfer which is influenced by gravity effect when the heatsink is vertically mounted. In the meantime, it can also significantly improve the heat spreading on the whole large heatsink. The better heat spreading over the large heatsink can further increase heatsink cooling efficiency and dissipate more heat with same heatsink dimension. On the other hand, it can help to make the product smaller and lighter in the same heat dissipation condition.

In the above-mentioned embodiment, through holes 12 are formed in the separators between adjacent substantially closed zones 11. That is, narrow interconnecting channels are kept open between the substantially closed zones 11. This can ensure the vapor pressure balance between the heatsink base channel and the heatsink fin channel.

In the above-mentioned embodiment, the heatsink fin 2 is made from two halves which are soldered together, each half being produced by sheet metal process such as stamping. By using such a highly efficient manufacturing method, the heatsink fin production could be scaled up to big volume with lower cost compared with current roll bonding process. This will benefit a lot on 5G radio product's heatsink production which will need over 20 pieces long fins extending from the heatsink base 1 to handle large heat dissipation.

In the above-mentioned embodiment, the heatsink is a three-dimensional phase change heat transfer heatsink. However, the present disclosure is not limited to this. In another embodiment, the heatsink base 1 may be a conventional one without internal space or refrigerant, while the heatsink fins 2 are configured as described above. With such a kind of two-dimensional phase change heat transfer heatsink, when the temperature of the heatsink fins 2 reaches the boiling point of the refrigerant, a boiling phenomenon will happen and generate bubbles in the flow channels inside the heatsink fins 2. Due to the separators 23 which serves as bubble flow guiders, the boiling bubbles will not rise upward directly inside the heatsink fins 2, and will flow from the fin bottom 21 to the fin top 22 along the separators 23. Then, the bubbles will enter into the public channel 24 and rise to the refrigerant level in the end. Thus, it also helps to spread heat from the fin bottom 21 to the fin top 22 and from the fin lower side to the fin upper side. That is, the heat spreading on the heatsink fins can be significantly improved.

In other embodiments of a phase change heat transfer heatsink, the heatsink fins 2 may be different from those as described above. For example, in an embodiment, at least some of the heatsink fins 2 are not provided with internal space or flow channels for refrigerant. In another embodiment, the flow channels of the heatsink fin(s) 2 extend horizontally from the fin bottom 21 towards the fin top 22. In still another embodiment, at least some of the heatsink fins 2 have an integral internal space for refrigerant, without bubble flow guiders such as separators 23. With the above phase change heat transfer heatsink, uneven phase change heat transfer in the heatsink base 1 can be restrained.

The present disclosure also relates to a communication device comprising the above heatsink and a plurality of heat sources contacting the heatsink base at a side opposite to the heatsink fins.

References in the present disclosure to "an embodiment", "another embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A heatsink comprising a heatsink base and a plurality of heatsink fins, each heatsink fin including a fin bottom joined to the heatsink base and a fin top opposite to the fin bottom, wherein a plurality of flow channels are formed in at least one of the heatsink fins to extend obliquely from the fin bottom towards the fin top, and the plurality of flow channels merge into a public channel formed at the fin top.

2. The heatsink according to claim 1, wherein the plurality of flow channels and the public channel are formed at a lower part of the at least one heatsink fin and are filled with refrigerant.

3. The heatsink according to claim 1, wherein the public channel is communicated with an upper space of the at least one heatsink fin which is not filled with refrigerant.

4. The heatsink according to claim 1, wherein the at least one heatsink fin is made from two halves which are soldered together, each half being formed from sheet metal.

5. The heatsink according to claim 1, wherein the heatsink base has an internal space, a lower portion of which comprises multiple substantially closed zones, each zone being communicated with one or more of the plurality of flow channels in the at least one heatsink fin.

6. The heatsink according to claim 5, wherein through holes for pressure balance are formed in a separator between each adjacent pair of substantially closed zones.

7. The heatsink according to claim 5, wherein the substantially closed zones of the heatsink base are filled with refrigerant, and an upper portion of the internal space of the heatsink base is not filled with refrigerant.

8. The heatsink according to claim 1, wherein the heatsink base has an internal space, a lower portion of the internal space is filled with refrigerant and is divided into substantially closed zones, and an upper portion of the internal space is not filled with refrigerant.

9. The heatsink according to claim 8, wherein through holes for pressure balance are formed in a separator between each adjacent pair of substantially closed zones.

10. A communication device, comprising a plurality of heat sources and the heatsink according to claim 1, wherein the heat sources contact the heatsink base at a side opposite to the heatsink fins.

11. The communication device according to claim 10, wherein the heatsink is vertically mounted.

12. The communication device according to claim 10, wherein distribution of the substantially closed zones of the heatsink base corresponds to distribution of the heat sources.

* * * * *